United States Patent
Kim

(10) Patent No.: US 9,055,666 B2
(45) Date of Patent: Jun. 9, 2015

(54) CLIP TERMINAL FOR FIXING CASE AND SHIELD APPARATUS USING THE SAME

(75) Inventor: Sun-Ki Kim, Gunpo-si (KR)

(73) Assignees: Joinset Co., Ltd. (KR); Sun-Ki Kim (KR)

( * ) Notice: Subject to any disclaimer, the term of this patent is extended or adjusted under 35 U.S.C. 154(b) by 429 days.

(21) Appl. No.: 13/473,907

(22) Filed: May 17, 2012

(65) Prior Publication Data

US 2013/0148318 A1      Jun. 13, 2013

(30) Foreign Application Priority Data

Dec. 9, 2011  (KR) .................. 10-2011-0131822
Apr. 13, 2012 (KR) .................. 10-2012-0038438

(51) Int. Cl.

| H05K 7/16 | (2006.01) |
| --- | --- |
| H05K 5/00 | (2006.01) |
| H05K 1/14 | (2006.01) |
| H05K 7/00 | (2006.01) |
| H05K 7/14 | (2006.01) |
| H05K 7/18 | (2006.01) |
| H05K 9/00 | (2006.01) |
| H05K 7/12 | (2006.01) |
| H05K 3/34 | (2006.01) |

(52) U.S. Cl.
CPC ............ *H05K 9/0035* (2013.01); *H05K 9/0009* (2013.01); *H05K 9/0024* (2013.01); *H05K 9/0032* (2013.01); *H05K 7/14* (2013.01); *H05K 7/12* (2013.01); *H05K 7/1405* (2013.01); *H05K 7/1417* (2013.01); *H05K 9/00* (2013.01); *H05K 3/341* (2013.01); *H05K 2201/10371* (2013.01); *H05K 2201/10962* (2013.01)

(58) Field of Classification Search
CPC ......... H05K 7/12; H05K 7/14; H05K 7/1405; H05K 7/1417; H05K 9/00; H05K 9/0009; H05K 9/0024; H05K 9/0032; H05K 9/0035
USPC ................. 361/726, 732, 740, 743, 759, 777, 361/800–802, 816, 818
See application file for complete search history.

(56) References Cited

U.S. PATENT DOCUMENTS

| 5,029,254 | A * | 7/1991 | Stickney ........................ 174/354 |
| 5,354,951 | A * | 10/1994 | Lange et al. .................. 174/372 |
| 6,051,781 | A * | 4/2000 | Bianca et al. ................. 174/351 |
| 6,267,629 | B1 * | 7/2001 | Nguyen et al. ................ 439/857 |
| 7,443,693 | B2 * | 10/2008 | Arnold et al. ................. 361/800 |
| 7,501,587 | B2 * | 3/2009 | English .......................... 174/354 |

FOREIGN PATENT DOCUMENTS

JP      2011198839  A  * 10/2011

* cited by examiner

*Primary Examiner* — Jayprakash N Gandhi
*Assistant Examiner* — Zhengfu Feng
(74) *Attorney, Agent, or Firm* — Park & Associates IP Law, P.C.

(57) ABSTRACT

A clip terminal soldered to and mounted on a circuit board, includes a connection part bent at an angle corresponding to that of a corner of a case and at least a pair of clips connected to each other by the connection part. The connection part and the clips are integrated with each other. The connection part has a width less than or equal to that of a solder pattern of the circuit board on which the clip terminal is soldered. A lower end of the corner of a sidewall of the case is fitted into the clips.

22 Claims, 8 Drawing Sheets

(a)

(b)

CLIP TERMINAL FOR FIXING CASE AND SHIELD APPARATUS USING THE SAME

REFERENCE TO RELATED APPLICATIONS

This application claims the priority benefit of Korean Patent Application No. 10-2011-0131822 filed on Dec. 9, 2011, and Korean Patent Application No. 10-2012-0038438 filed on Apr. 13, 2012, the entire contents of which are incorporated herein by reference.

FIELD OF THE INVENTION

The present invention relates to a clip terminal for fixing a case, and more particularly, to a clip terminal which is used for fixing a case to a solder pattern of a circuit board. Furthermore, the present invention relates to an electromagnetic interference (EMI) shield apparatus in which a clip terminal is fitted into a corner of an EMI shield case and integrated therewith.

BACKGROUND OF THE INVENTION

EMI shield cases are used to prevent electromagnetic waves generated in high frequency electronic components or modules, which are used for electronic equipments and information communication equipments, from leaking to the outside or protect the high frequency electronic components or modules against external electromagnetic waves.

Such an EMI shield case is made of an electrically conductive material such as a metal sheet to shield electromagnetic waves. Also, the EMI shield case has a box shape with at least one surface opened to cover electronic components or modules mounted on a printed circuit board (PCB).

As described above, the EMI shield case is mounted on a ground pattern of the PCB. Here, the EMI shield case may be separated from the ground pattern of the PCB so that the electronic components and modules mounted therein can be easily repaired. For this, a lower end of a sidewall of the shield case may be inserted into a metal chip previously soldered on the ground pattern.

All the typical metal clips have linear shapes, respectively. Thus, it may be difficult to fit the lower end of the sidewall of the shield case into the metal clip due to a small alignment margin of the metal clip. In addition, since the metal clip having the linear shape is fitted merely into the sidewall of the shield case, a coupling force between the metal clip and the shield case is low. Thus, a large number of metal clips should be used to reinforce the coupling force between the metal clip and the shield case. Also, when the shield case is manufactured through a press process including cutting and bending, a gap may occur in a corner of the shield case with the corner cut. Thus, when the shield case is repeatedly mounted or separated, the gap may be more widened to reduce EMI shielding efficiency.

To solve this limitation, a clip terminal which decides and maintains a position of a shield case is disclosed in Japanese Patent Publication No. 2011-198839. Here, the clip terminal is disposed approaching a side surface of the shield case from the outside and has a sidewall including a bent part which is bent in an L-shape along the side surface of the shield case at a corner of the shield case.

However, since the clip terminal should have the L-shaped bent part, the process of manufacturing the clip terminal may be complicated. Furthermore, a pair of clips may have shapes and sizes different from each other with respect to an absorption surface due to the L-shaped bent part. Thus, when a reflow soldering process is performed and the clip terminal is picked up, it may be difficult to mount the clip terminal at a desired position on fused solder cream having low viscosity due to large shake of the clip terminal. In addition, the absorption surface may have a width greater than that of a plate of each of the clips. As a result, the absorption surface may occupy a wide area on a printed circuit board on which the clip terminal is mounted. Thus, the clip terminal may be incongruous with existing electronic equipments in which a high-density mounting technology is required.

These problems are not limited merely to the clip terminal for fixing the EMI shield case, but may also occur in a clip terminal for fixing a case which protects internal electronic components against external impacts.

SUMMARY OF THE INVENTION

An object of the present invention is to provide a clip terminal which allows a case to be easily fitted and minimizes a mounting area on a circuit board.

Another object of the present invention is to provide a clip terminal having a simple structure.

A further another object of the present invention is to provide a clip terminal of which both sides have the same shape and size with respect to a bent connection part to reduce shake during reflow soldering.

An even further another object of the present invention is to provide a clip terminal which improves reliability of reflow soldering even though a small amount of solder cream is used.

According to an aspect of the present invention, there is provided a clip terminal for fixing a case, which is soldered to and mounted on a circuit board, the clip terminal including: a connection part bent at an angle corresponding to that of a corner of a case; and at least a pair of clips connected to each other by the connection part, wherein the connection part and the clips are integrated with each other, the connection part has a width less than or equal to that of a solder pattern of the circuit board on which the clip terminal is soldered, and a lower end of a corner of a sidewall of the case is fitted into the clips.

The solder pattern may be provided in plurality, and the plurality of solder patterns may be connected to or separated from each other to correspond to the clip terminal for fixing the case.

The solder pattern may be disposed on a ground pattern of the circuit board.

A slit having a predetermined length or a notch having a width greater than that of the slit may be defined in each of both ends in a width direction thereof on a boundary on which each of the clips contacts the connection part.

An auxiliary fixing part soldered to the solder pattern may be further disposed outside an end of each of the clips.

A bottom of the connection part and a bottom surface of the clip terminal may be horizontally disposed with respect to each other.

Both sides of the clip terminal may be symmetrical to each other on the basis of a bent position of the connection part.

Each of the clips may include a fixed part soldered to the solder pattern and elastic pieces integrally protruding from both sides in a width direction of the fixed part to corresponding to each other, and an inner elastic piece and an outer elastic piece of the elastic pieces corresponding to each other may have heights different from each other.

An outer edge of the connection part may be chamfered to define a chamfer part or may have a rounded shape.

A support wall may uprightly protrude from the chamfer part. For example, the outer edge of the connection part may be rounded, and the support wall may protrude in a rounded shape. Alternatively, the support wall may be provided in a pair perpendicular to each other, and the pair of support walls may be spaced a fine distance from each other.

A plurality of notches may be defined along edges of both sides of the connection part.

The soldering process may be a reflow soldering process using solder cream.

The clip terminal may be manufactured by pressing a metal sheet.

The clip terminal may be reel-taped and vacuum-picked up so as to perform a reflow soldering process.

According to another aspect of the present invention, there is provided an electromagnetic interference (EMI) shield apparatus including: an EMI shield case; and a clip terminal comprising a connection part bent at an angle corresponding to that of a corner of a case and at least a pair of clips connected to each other by the connection part, wherein the connection part and the clips are integrated with each other, the connection part has a width less than or equal to that of a solder pattern of the circuit board on which the clip terminal is soldered, and the clip terminal is fitted into a lower end of a corner of a sidewall of the EMI shield case.

A clip terminal receiving groove for receiving the clip terminal may be defined in the lower end of the edge of the sidewall of the EMI shield case in which the clip terminal is fitted.

The EMI shield apparatus may be carried in a reel-taped state, and the clip terminal may be soldered to the ground pattern using a surface mounting process.

The EMI shield case may not be soldered with solder.

The edge of the sidewall of the EMI shield case may be vertically cut, and a gap may be defined between the cut sidewalls.

The EMI shield case may be manufactured by pressing a metal sheet.

BRIEF DESCRIPTION OF THE DRAWINGS

The above objects and other advantages of the present invention will become more apparent by describing in detail preferred embodiments thereof with reference to the attached drawings in which.

DETAILED DESCRIPTION OF THE INVENTION

Now, preferred embodiments of the present invention will be described in detail with reference to the accompanying drawings.

Figure 1:
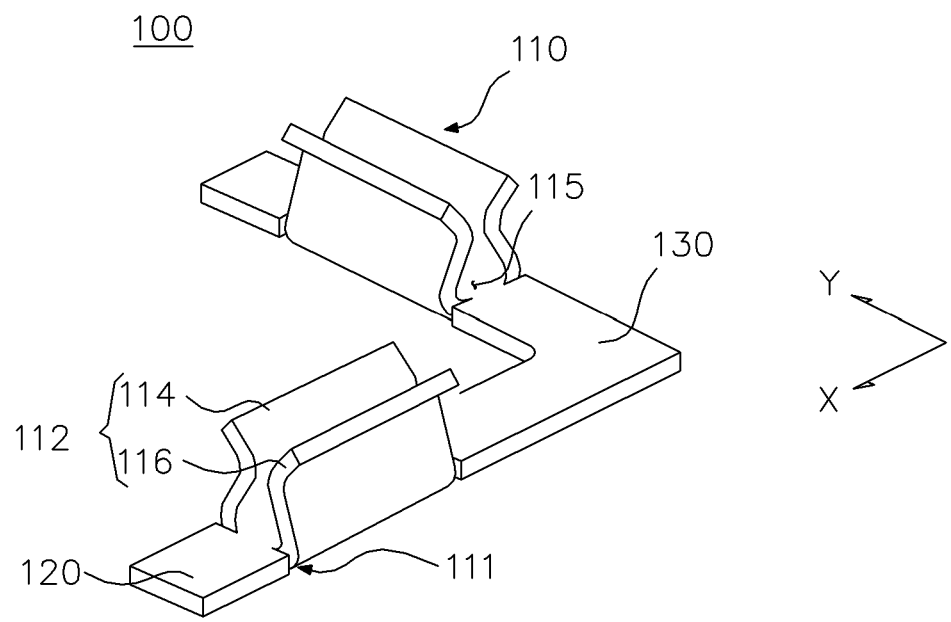
FIG. 1 is a perspective view of a clip terminal according to an embodiment of the present invention.
Figure 2:
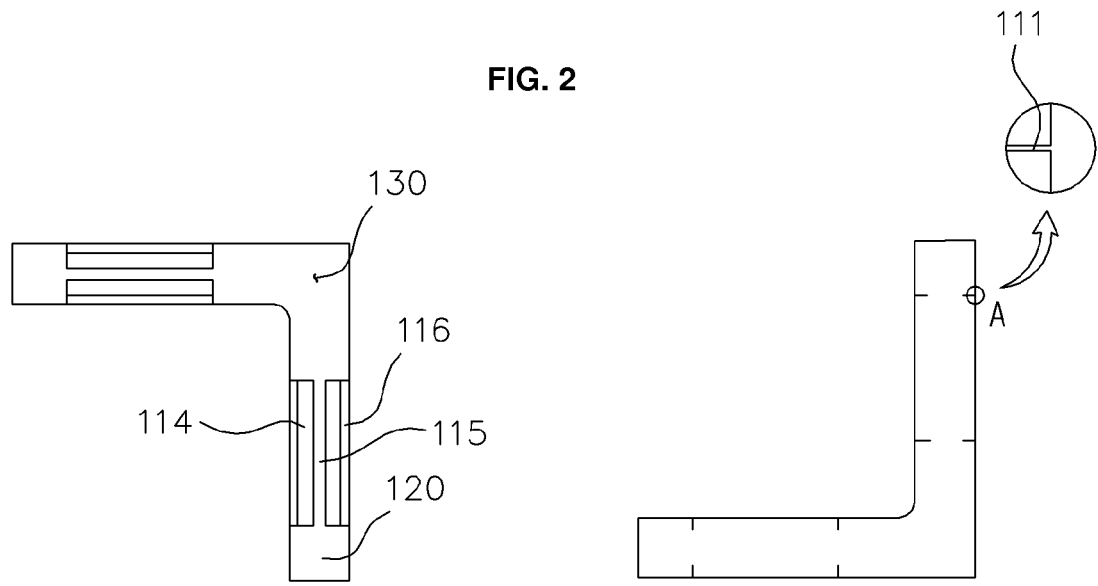
FIG. 2 is plan and bottom views of the clip terminal according to an embodiment of the present invention.

FIG. 1 is a perspective view of a clip terminal according to an embodiment of the present invention. FIG. 2 is plan and bottom views of the clip terminal. FIGS. 3(a) and 3(b) illustrating a state in which the clip terminal of FIG. 1 is soldered using solder cream disposed on a solder pattern to fix a case.

A clip terminal 100 according to an embodiment of the present invention includes a connection part 130 bent at an angle corresponding to that of a corner of a case 10, e.g., an angle of about 90° and a pair of clips 110 integrally disposed on both ends of the connection part 130. Selectively, auxiliary fixing parts 120 may extends outward from ends of the clips 110, respectively.

Figure 3:
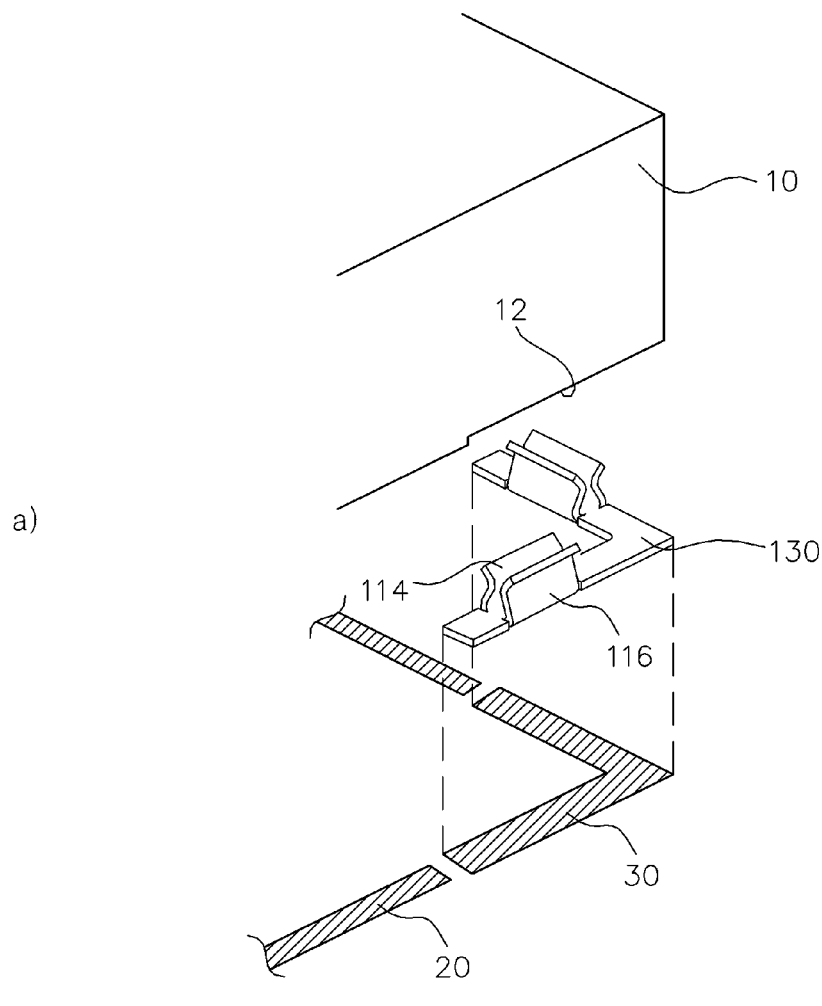
FIGS. 3(a) and 3(b) are views illustrating a state in which the clip terminal of FIG. 1 is soldered using solder cream disposed on a solder pattern to fix a case.
Figure 3:
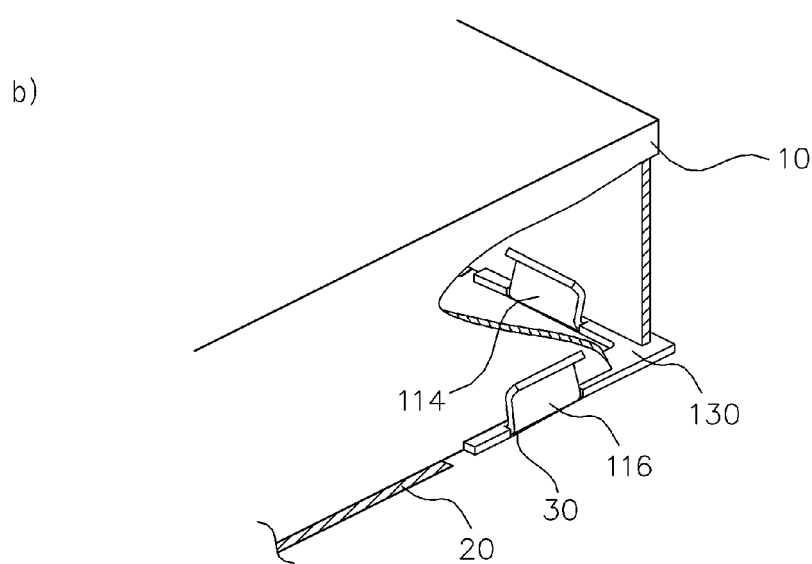

Referring to FIG. 3, the connection part 130 has a width equal to or less than that of a solder pattern 30. Also, each of the auxiliary fixing parts 120 and the clips 110 has a width equal to or less than that of the solder pattern 30.

The solder pattern 30 may be electrically connected to or separated from a ground pattern 20. The solder pattern 30 may have a width equal to or different from that of the ground pattern 20. In this embodiment, the solder pattern 30, on which a clip terminal 100 is mounted, electrically and physically separated from the ground pattern 20 will be described as an example.

According to this embodiment, even though the clip terminal 100 has a simple structure, since the clip terminal 100 is bent at an angle corresponding to that of the corner of the case 10, the case 10 may be easily fitted into the clip terminal 100. Also, since the clip terminal 100 is mounted on only the solder pattern 30 regardless of the ground pattern 20, the clip terminal 100 may occupy a narrow area on a circuit board. Thus, other components may be mounted at high density.

However, the present invention is not limited to the above-described structure. For example, the ground pattern 20 and the solder pattern 30 may extend from each other and thus be connected to each other, or the solder pattern 30 may be disposed on the ground pattern 20. Alternatively, the solder pattern 30 may be used as the ground pattern 20. Also, the solder pattern 30 is coated with solder cream.

Both sides of the clip terminal 100 may have the same shape and size with respect to a bent portion of the connection part 130 so that both sides of the clip terminal 100 are bilaterally symmetrical to each other. Thus, when a reflow soldering process is performed and the clip terminal is picked up, the shake of the clip terminal 100 may be reduced to easily reflow-solder the clip terminal 100 on a desired position of a printed circuit board.

Although one clip 110 is disposed in each of X and Y directions in FIG. 1, the present invention is not limited thereto. For example, a plurality of clips may be disposed adjacent to each other in each direction.

In this embodiment, each of the clips 110 includes a fixed part 115 soldered to the solder pattern 30 and a support part 112 supporting the case 10. The support part 112 includes a pair of elastic pieces 114 and 116 integrally protruding from both sides in a width direction of the fixed part 115. The connection part 130 may be optionally adjusted in length. Also, the connection part 130 has a flat vacuum pick-up area on a surface thereof. For example, the connection part 130 may be manufactured in a state where it is bent at an angle of about 90°.

Referring to FIG. 2, slits 111, each having a predetermined length, are defined in both ends in a width direction of each clip 110 on each of boundaries on which each clip 110 contacts the connection part 130 and the auxiliary fixing part 120. Thus, when the elastic pieces 114 and 116 are bent upward, a distance between outer rounded portions of the elastic pieces 114 and 116 may be easily adjusted to have the same width as that of the connection part 130 or the auxiliary fixing part 120. Here, although the slits 111 are configured to easily bend the clips 110 upward, the present invention is not limited thereto.

In this embodiment, the clip terminal 100 has a horizontal bottom surface, and the bottom surface of the clip terminal 100 is soldered to the solder pattern 30 of the circuit board. Here, the bottom surface of the clip 110 may be spaced from the solder pattern 30 of the circuit board to prevent a lead-rising phenomenon in which solder rises along the elastic pieces 114 and 116 of the clip 110 from occurring (that will be described later). Alternatively, both ends of the bottom of the clip 110 may be lift up, coated with lead-rising prevention ink, or processed using laser.

The clip terminal 100 may be manufactured by pressing a metal such as a stainless steel and then being coated with tin (Sn) which is solderable with the solder cream.

The clip terminal 100 may be reflow-soldered using a surface-mount technology (SMT) in a state where the clip terminal 100 is reel-packaged within a carrier.

According to the above-described structure, a pick-up device may pick the clip terminal 100 up using the vacuum pick-up area of the connection part 130 to carry the clip terminal 100 onto the solder cream disposed on the solder pattern 30 of the circuit board so as to perform the reflow soldering process.

Although the elastic pieces 114 and 116 face each other and elastically contact each other in FIG. 1, the present invention is not limited thereto. For example, the elastic pieces 114 and 116 may be crossed each other. Also, the pair of elastic pieces 114 and 116 may include an embossment for improving elasticity or an elastic unit such as a projection protruding inward by cutting.

Referring to FIG. 3, in a state where the fixed part 115 of each of the clips 110, the connection part 130 connecting the clips 110 to each other, and the auxiliary fixing part 120 are soldered to the solder pattern 30 of the circuit board, a lower end of a corner of the case 10 may be fitted into the elastic pieces 114 and 116 and thus fixed to the clip terminal 100.

Alternatively, a case 10 in which the clip terminal 100 is fitted may be reel-packaged within the carrier or packaged within a tray and then carried. In this case, the case 10 is mounted on the ground pattern 20 using the SMT, and the bottom surface of the clip terminal 100 is reflow-soldered to the solder pattern 30 of the circuit board.

When the case 10 has conductivity, the solder pattern 30 may be electrically connected to the ground pattern 20 or disposed on the ground pattern 20 to utilize the case 10 as an apparatus for shielding electromagnetic waves.

As described above, when the case 10 has conductivity, the case 10 may constitute an EMI shield case, and the EMI shield case 10 in which the clip terminal 100 is fitted may constitute an EMI shield apparatus. In this case, the bottom surface of the clip terminal 100 may be reflow-soldered to the solder pattern 30 to mount the EMI™ shield apparatus. Then, as necessary, the EMI shield case 10 may be separated from the clip terminal 100.

The case 10 is manufactured by pressing a stainless steel plate. The case is not reflow-soldered using the solder cream. Also, a corner of a sidewall of the case 10 may be vertically cut to form a gap.

A clip receiving groove 12 is defined in a lower end of the corner of the sidewall of the case 10 to closely attach the lower end of the sidewall of the case 10 to the ground pattern 20.

Figure 4A:
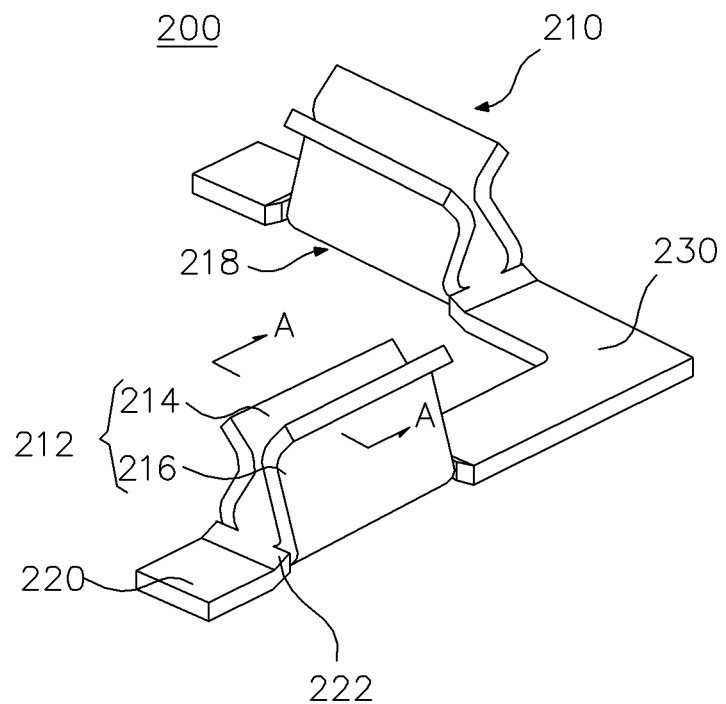
FIG. 4(a) is a perspective view of a clip terminal according to another embodiment of the present invention.

FIG. 4(a) is a view of a clip terminal 200 according to another embodiment of the present invention. FIG. 4(a) is a view illustrating a state of separated solder pattern 30a and 30b for soldering the clip terminal 200.

In this embodiment, inclination parts 222 may be disposed between an auxiliary fixing part 220 and a clip 220 and between a connection part 230 and the clip 210 so that a bottom surface of the clip 210 may be separated from a circuit board to form a gap 218. Thus, a bottom surface of the connection part 230 is soldered to the solder pattern 30a, and a bottom surface of the auxiliary fixing part 220 is soldered to the solder pattern 30b.

When a case fitted into the clip terminal 200 has conductivity and is used as an apparatus for shielding electromagnetic waves, the solder pattern 30b may be electrically connected to a ground pattern 20 using a via hole. However, the present invention is not limited thereto.

The separated solder patterns 30b may be symmetrical to each other with respect to the solder pattern 30a.

In this embodiment, since the solder pattern 30b is separated, a small amount of solder cream may be used. Also, since the solder patterns 30b are symmetrical to each other with respect to the solder pattern 30a, a reflow soldering may have reliability.

Figure 4B:
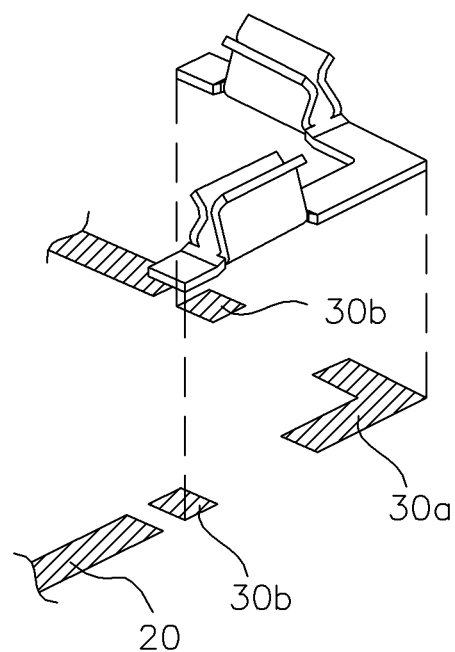
FIG. 4(b) is a view illustrating a state of separated solder patterns for soldering the clip terminal.
Figure 5:
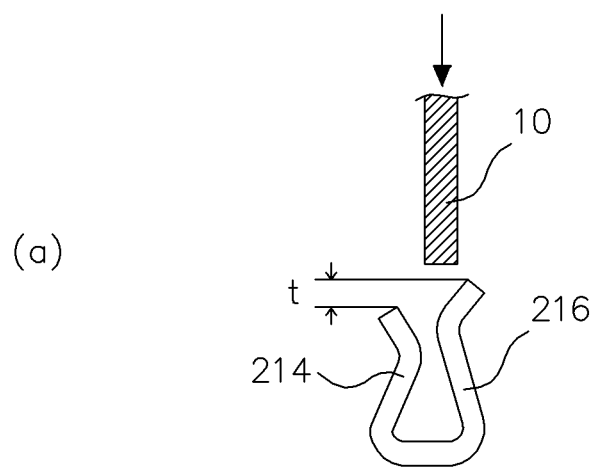
FIG. 5 is a sectional view taken along line A-A of FIG. 4.
Figure 5:
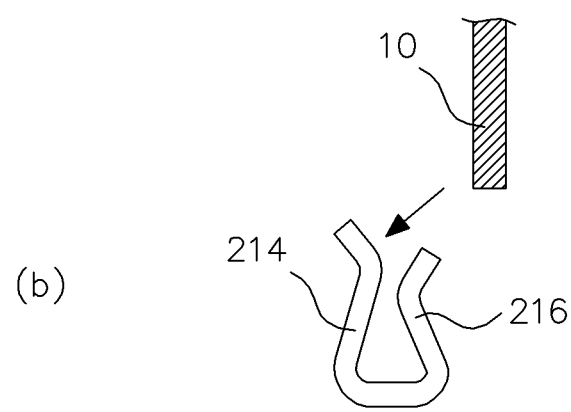

FIG. 5 is a sectional view taken along line A-A of FIG. 4.

Referring to FIG. 5(a), an inner elastic piece 214 of elastic pieces 214 and 216 facing each other of each clip 210 has a height less by the height t than that of the outer elastic piece 216.

Thus, even though the case 10 biasedly descends outward with respect to a middle position between the elastic pieces 214 and 216, a lower of a sidewall of the case 10 may be hung first on the outer elastic piece 216 having a relatively great height and then slid along a surface of the elastic piece 216. Thus, the case 10 may be smoothly inserted between the elastic pieces 214 and 216.

On the other hand, as shown in FIG. 5(b), the inner elastic piece 214 may have a height greater than that of the outer elastic piece 216.

Thus, even though the case 10 biasedly descends from the outside toward the inside, the lower end of the sidewall of the case 10 may be hung on the inner elastic piece 214. Here, since the elastic piece 214 guides the case 10, the case 10 may be slid along a surface of the elastic piece 214 and thus smoothly inserted between the elastic pieces 214 and 216.

Figure 6:
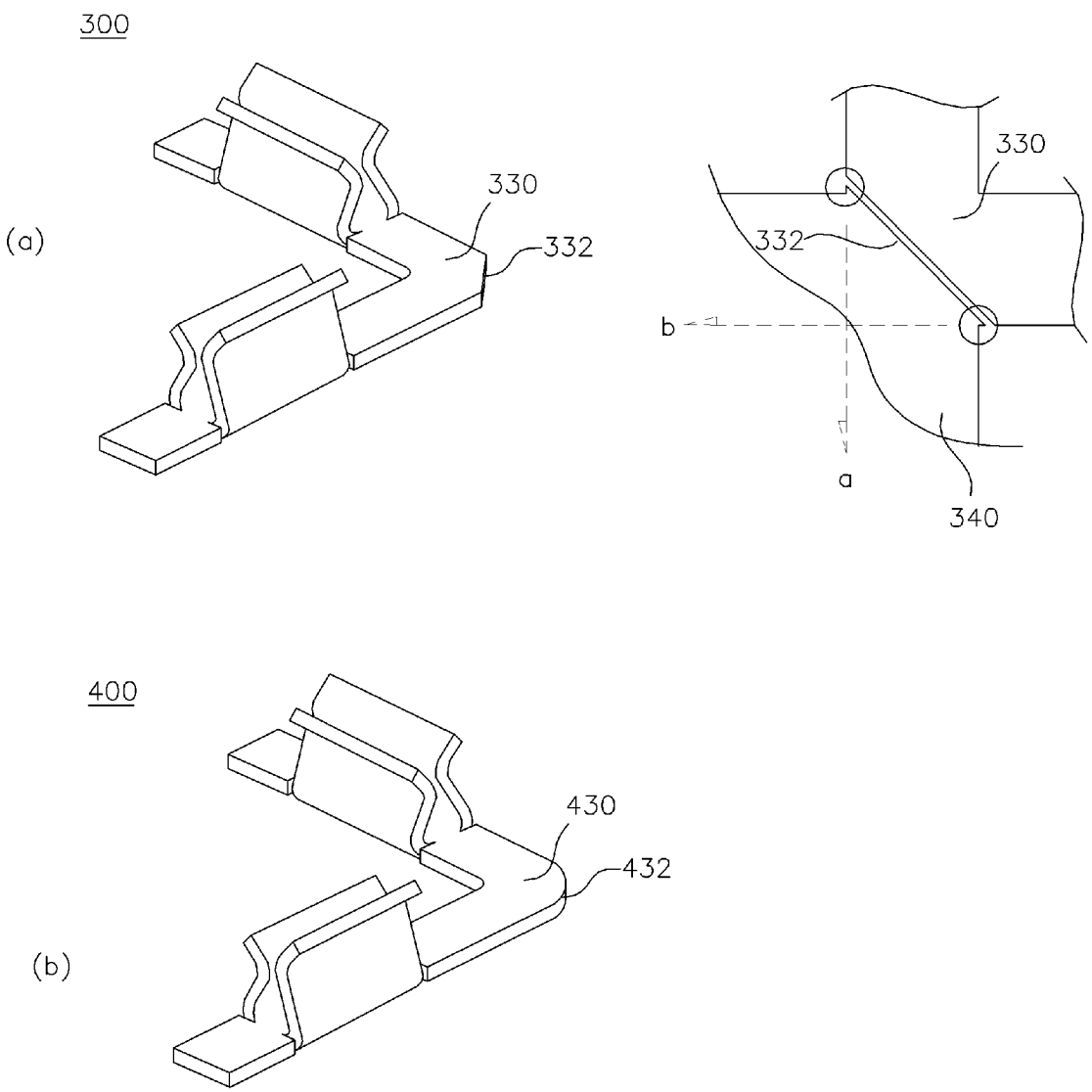
FIG. 6 is a view of a clip terminal according to another embodiment of the present invention.

FIG. 6 is a view of clip terminals 300 and 400 according to another embodiment of the present invention.

Referring to FIG. 6(a), an outer edge of a connection part 330 of a clip terminal 300 is chamfered to define a chamfer part 332. Referring to FIG. 6(b), an outer edge of a connection part 430 of a clip terminal 400 is roundly cut to define a round part 432.

As described above, when the outer edges of the connection parts 330 and 430 are chamfered or rounded, bottom surfaces of the clip terminals 300 and 400 may be easily manufactured to have a reliable plane shape. Thus, when a reflow soldering process is performed and the clip terminal 300 or 400 is picked up, the shake of the clip terminal 300 or 400 may be reduced.

Also, the clip terminal is manufactured using a press process. Here, the press process includes a process of cutting a thin iron strip. As shown in FIG. 6(a), when the chamfering process is performed, the edge of the connection part 330 is cut twice in "a" and "b" directions perpendicular to each other as shown by arrows of FIG. 6(a). Here, in portions shown as circles of FIG. 6(a), a cutting device cuts a strip portion and a portion in which a strip 340 does not exist at the same time. Thus, when the edge of the connection part 330 is vertically cut, in the portion in which the strip 340 does not exist, a sidewall of the strip 340 is slicely stripped. As a result, the slicely stripped sidewall of the strip 340 is pushed downward toward a bottom surface of the strip 340 to form a burr protruding from the bottom surface.

Thus, when a surface mounting process is performed, there is a limitation that the connection part 330 has an uneven bottom surface. Therefore, it may be difficult to perform a reflow soldering process having reliability.

To solve the above-described limitation, the outer edge of the connection part 330 may be cut and chamfered at a time to minimize an occurrence of the burr. Specifically, the cutting may be performed stepping aside from a boundary between the strip 340 and the connection part 330.

FIG. 7 is a view of clip terminals 500, 600, and 700 according to another embodiment of the present invention.

Figure 7A:
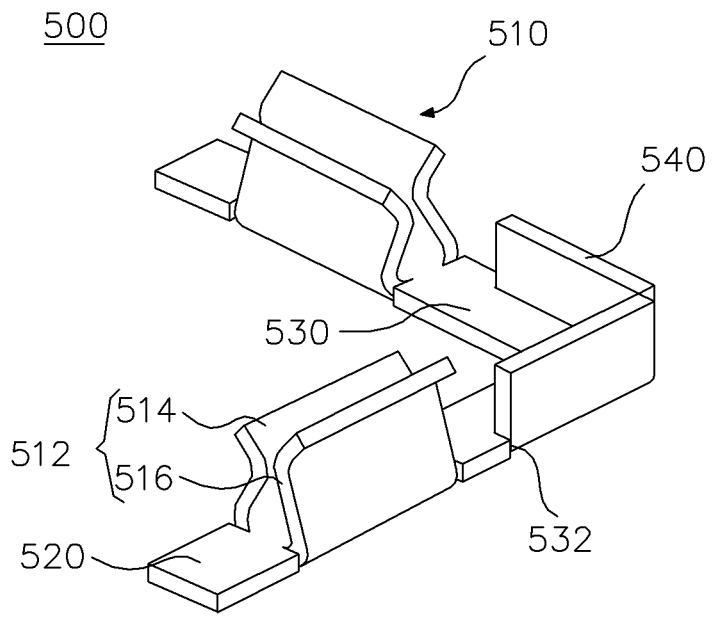
FIG. 7 is a view of a clip terminal according to another embodiment of the present invention.
Figure 7B:
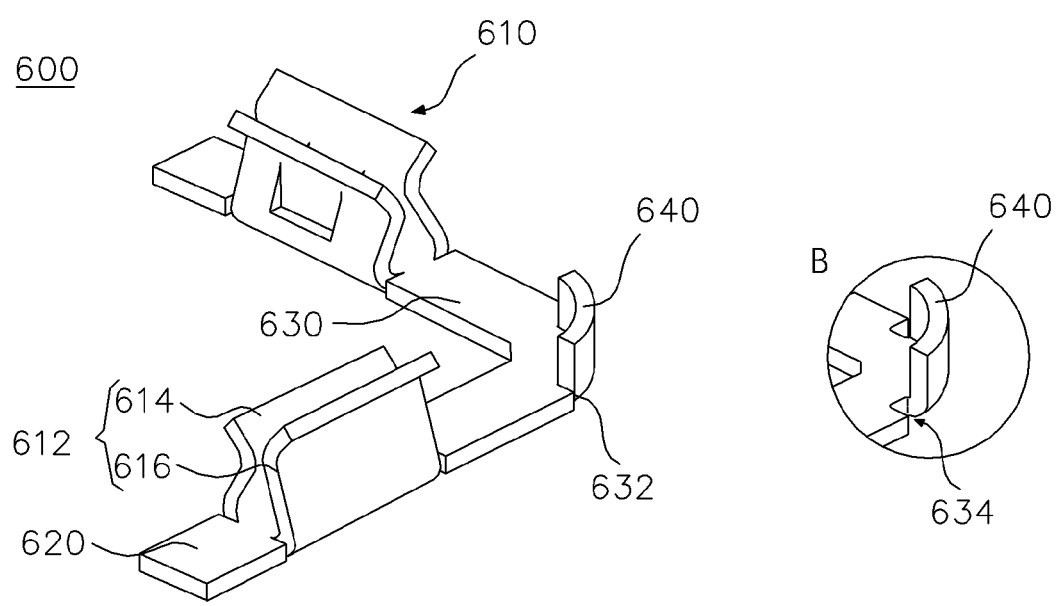
Figure 7C:
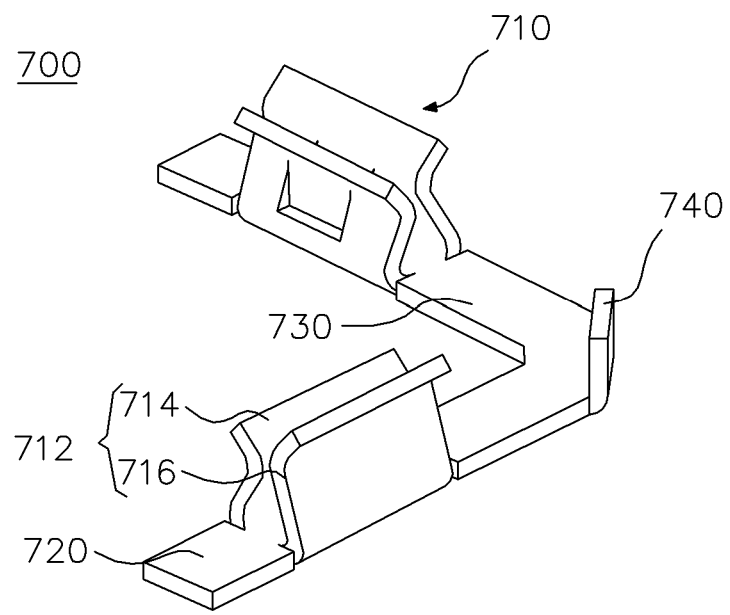
Figure 7D:
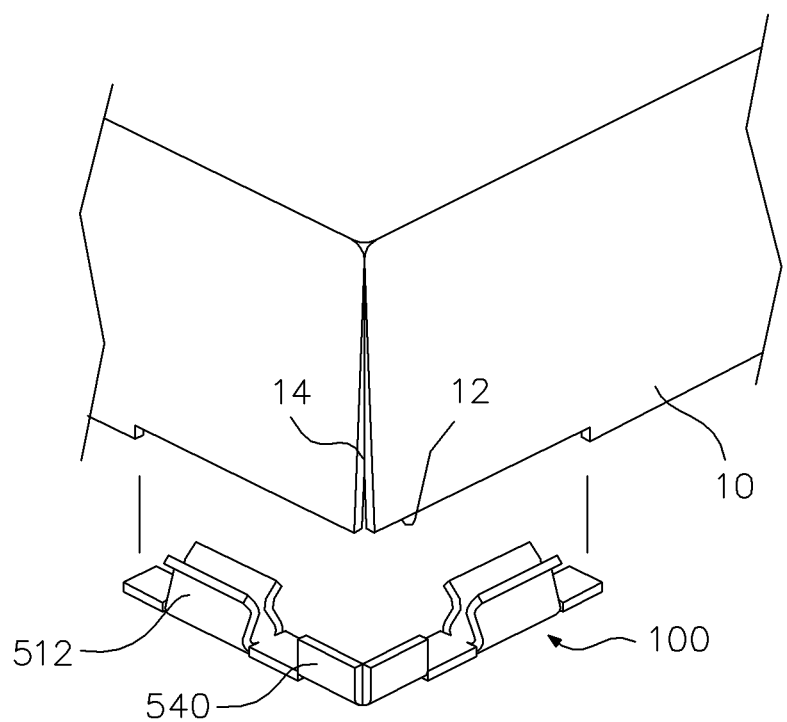

Referring to FIG. 7(d), a corner of a sidewall of a case 10 may be vertically cut, and a gap 14 may be defined between the cut sidewalls. Thus, the case 10 itself may be reduced in strength due to the gap 14. Specifically, when the case 10 is utilized for shielding electromagnetic waves, the electromagnetic waves may leak through the gap 14.

FIGS. 7(a) to 7(c) illustrate structures proposed for solving the above-described limitation. That is, support walls 540, 640, and 740 uprightly protrude along an outer edge thereof to include outer edges of connection parts 530, 630, and 730, respectively. Here, 'an edge' denotes a portion defined along a periphery of the connection part, and 'a corner' denotes a portion at which the edge is bent, wherein each of the edge and the corner may have inside and outside portions thereof.

Thus, since the corners of the case 10 are pushed and pressed by the support walls 540, 640, and 740, respectively, the gap 14 becomes narrow. Thus, the case 10 may be increased in strength. Therefore, when the case 10 is utilized for shielding the electromagnetic waves, it may effectively prevent the electromagnetic waves from leaking through the gap 14.

The support walls 540, 640, and 740 are not specifically limited in height. However, each of the support walls 540, 640, and 740 may have a height less than that of each of elastic pieces 214 and 216. This is done because of reduction of material and easy vacuum pick-up. When the outer elastic piece 216 has a height greater than that of the inner elastic piece 214, each of the support walls 540, 640, and 740 may have a height less than that of the outer elastic piece 216.

Also, slits 532 and 632, each having a narrow width, are defined in both sides of the support walls 540 and 640, respectively. The slits 532 and 632 may be configured to easily bend the support walls 540 and 640 upward. Specifically, as shown in a circle B of FIG. 7(b), a notch 634 having a wide width may be defined in each of both sides of the support wall 640.

As shown in FIG. 7(a), the support wall 540 may be provided in a pair perpendicular to each other, and the pair of support walls 540 may be spaced a fine distance from each other. Alternatively, as shown in FIG. 7(b), the support wall 640 may be provided as a single unit having a rounded shape.

Specifically, when the support wall 540 is spaced from each other as shown in FIG. 7(a), the support wall 540 may be easily processed, and also improve elasticity by contacting the case 10.

Also, as shown in FIG. 7(c), when the outer edge is chamfered, the support wall 740 may uprightly protrude from only the chamfered portion. In this case, a corner of the case 10 may be pushed by the support wall 740 to effectively narrow the gap 14. Each of the support walls 540 and 640 may have an embossment on an inner surface thereof to contact closely the case 10, thereby improving sealing.

Figure 8:
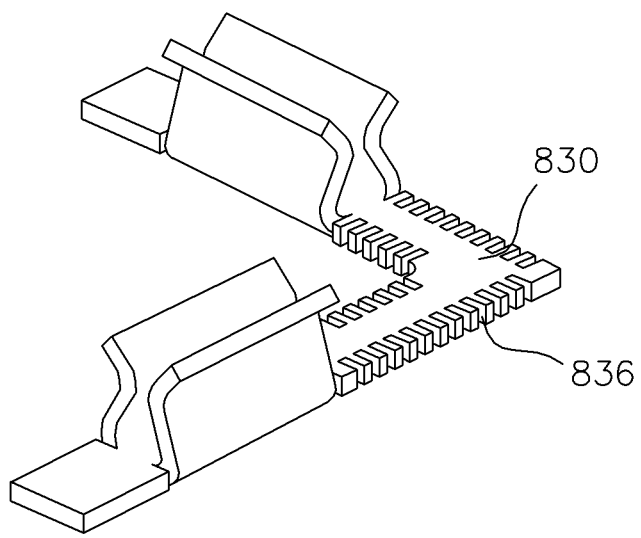
FIG. 8 is a view of a clip terminal according to another embodiment of the present invention.

FIG. 8 is a view of a clip terminal 800 according to another embodiment of the present invention.

In this embodiment, a plurality of notches 836 are defined along both edges of a connection part 830.

Thus, when the clip terminal 800 is soldered to a solder pattern, solder cream may be introduced into the notches 836 and then cured. As a result, there is an effect to increase a soldering area, thereby improving reliability of the soldering.

According to the above-described structure, the clip terminal may have a simple structure, and the case may be easily fitted into the clip terminal. Also, the connection part may have a width at least equal to or less than that of the solder pattern to occupy a narrow area on the circuit board on which the clip terminal is mounted, thereby realizing high-density mounting.

Also, both sides of the clip terminal may have the same shape and size with respect to the bent portion of the connection part so that both sides of the clip terminal are symmetrical to each other. Thus, when the reflow soldering process is performed and the clip terminal is picked up, the shake of the clip terminal may be reduced to easily reflow-solder the clip terminal on a desired position.

Also, the soldering clip terminal which can improve the improved reliability of the reflow soldering even though a small amount of solder cream is used may be provided.

While the present invention has been described in detail, it should be understood that various changes, substitutions and alterations can be made hereto without departing from the spirit and scope of the invention as defined by the appended claims.

What is claimed is:

1. A clip terminal for fixing a case, which is configured to be soldered to and mounted on a circuit board, the clip terminal comprising:
   a connection part having an angular shape with a horizontal portion and a vertical portion corresponding to that of a corner of a case; and
   at least a pair of clips disposed at the horizontal portion of the connection part, and at least another pair of clips disposed at the vertical portion of the connection part,
   wherein the connection part and the clips are integrally formed with each other,
   wherein the clips are configured to grasp a lower end of the corner of a sidewall of the case,
   wherein the connection part includes a chamfer part between the horizontal and vertical portions, said chamfer part having a support wall uprightly protruding from the chamfer part.

2. The clip terminal of claim 1, wherein a solder pattern is provided in plurality, and the plurality of solder patterns are connected to or separated from each other to correspond to the clip terminal for fixing the case.

3. The clip terminal of claim 1, wherein a solder pattern is disposed on a ground pattern of the circuit board.

4. The clip terminal of claim 1, wherein a slit or a notch is provided at a boundary between the clips and the connection part.

5. The clip terminal of claim 1, wherein an auxiliary fixing part for soldering to the solder pattern is further provided outside of each pair of the clips.

6. The clip terminal of claim 1, wherein a bottom surface of the connection part and a bottom surface of the clip terminal are planar with respect to each other.

7. The clip terminal of claim 1, wherein both sides of the clip terminal are symmetrical to each other with respect to an angular area of the connection part.

8. A clip terminal for fixing a case, which is configured to be soldered to and mounted on a circuit board, the clip terminal comprising:

a connection part having an angular shape with a horizontal portion and a vertical portion corresponding to that of a corner of a case; and at least a pair of clips disposed at the horizontal portion of the connection part, and at least another pair of clips disposed at the vertical portion of the connection part, wherein the connection part and the clips are integrally formed with each other, wherein the clips are configured to grasp a lower end of the corner of a sidewall of the case, wherein each of the pairs of clips comprises an inner elastic piece and an outer elastic piece, said inner and outer elastic pieces each having a lower portion converging to each other toward an intermediate portion closely located, and an upper portion diverging from each other from the intermediate portion, wherein said inner and outer elastic pieces have heights different from each other such that one of said inner and outer elastic pieces extend further outwardly to facilitate introduction of the lower end of the side wall of the case between the inner and outer elastic pieces of the clips as the case is descended for coupling to the clip terminal;

wherein an outer edge of the connection part is rounded or chamfered, and the support wall is uprightly protruded in a rounded or chamfer shape from the outer edge.

9. The clip terminal of claim 8, wherein the support wall has a height less than that of each of the clips.

10. The clip terminal of claim 8, wherein the support wall has an embossment on an inner surface thereof.

11. The clip terminal of claim 8, wherein a plurality of notches are formed along the horizontal and vertical portions of the connection part.

12. The clip terminal of claim 8, wherein the clip terminal is configured to be soldered to the circuit board by a reflow soldering process using solder cream.

13. The clip terminal of claim 8, wherein the clip terminal is manufactured by pressing a metal sheet.

14. The clip terminal of claim 8, wherein the horizontal and vertical portions of the connection part are met with an angle of about 90°.

15. The clip terminal of claim 8, wherein the clip terminal is reel-taped and vacuum-picked up so as to perform a reflow soldering process.

16. The clip terminal of claim 8, wherein the case is an electromagnetic interference (EMI) shield case having conductivity.

17. The clip terminal of claim 1, wherein a plurality of notches are formed along the horizontal and vertical portions of the connection part.

18. The clip terminal of claim 1, wherein the clip terminal is configured to be soldered to the circuit board by a reflow soldering process using solder cream.

19. The clip terminal of claim 1, wherein the clip terminal is manufactured by pressing a metal sheet.

20. The clip terminal of claim 1, wherein the horizontal and vertical portions of the connection part are met with an angle of about 90°.

21. The clip terminal of claim 1, wherein the clip terminal is reel-taped and vacuum-picked up so as to perform a reflow soldering process.

22. The clip terminal of claim 1, wherein the case is an electromagnetic interference (EMI) shield case having conductivity.

* * * * *